(12) United States Patent
Park et al.

(10) Patent No.: US 8,703,237 B2
(45) Date of Patent: Apr. 22, 2014

(54) METHODS OF FORMING A MATERIAL LAYER AND METHODS OF FABRICATING A MEMORY DEVICE

(75) Inventors: Hye-young Park, Gyeonggi-do (KR); Sung-lae Cho, Gyeonggi-do (KR); Jin-il Lee, Gyeonggi-do (KR); Do-hyung Kim, Gyeonggi-do (KR); Dong-hyun Im, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1378 days.

(21) Appl. No.: 12/465,975

(22) Filed: May 14, 2009

(65) Prior Publication Data
US 2009/0285986 A1  Nov. 19, 2009

(30) Foreign Application Priority Data
May 15, 2008 (KR) .......... 10-2008-0045072

(51) Int. Cl.
C23C 16/00 (2006.01)
B05D 5/12 (2006.01)

(52) U.S. Cl.
USPC .......... 427/252; 427/255.4; 427/255.7; 427/58; 427/127; 427/253; 438/132

(58) Field of Classification Search
USPC ................. 427/162, 166
See application file for complete search history.

(56) References Cited

U.S. PATENT DOCUMENTS

| | | | |
|---|---|---|---|
| 2007/0190683 A1* | 8/2007 | Bae et al. | 438/95 |
| 2008/0105541 A1* | 5/2008 | Strathmann | 204/286.1 |
| 2008/0142777 A1* | 6/2008 | Park et al. | 257/4 |
| 2008/0274281 A1* | 11/2008 | Kobrin et al. | 427/255.7 |
| 2013/0020194 A1* | 1/2013 | Strathmann | 204/284 |
| 2013/0183446 A1* | 7/2013 | Kawano et al. | 427/252 |

FOREIGN PATENT DOCUMENTS

| | | |
|---|---|---|
| KR | 1020060091160 A | 8/2006 |
| KR | 1020070023433 A | 2/2007 |
| KR | 10695168 B1 | 3/2007 |
| WO | WO 2007067604 A2 * | 6/2007 |

OTHER PUBLICATIONS

Nishi et al.; Halide Passivation of Germanium Nanowires; 210th ECS Meeting; 2006.*

* cited by examiner

*Primary Examiner* — Guinever Gregorio
(74) *Attorney, Agent, or Firm* — Myers Bigel Sibley & Sajovec, P.A.

(57) ABSTRACT

Provided are methods of forming a material layer by chemically adsorbing metal atoms to a substrate having anions formed on the surface thereof, and a method of fabricating a memory device by using the material layer forming method. Accordingly, a via hole with a small diameter can be filled with a material layer without forming voids or seams. Thus, a reliable memory device can be obtained.

14 Claims, 8 Drawing Sheets

METHODS OF FORMING A MATERIAL LAYER AND METHODS OF FABRICATING A MEMORY DEVICE

CROSS-REFERENCE TO RELATED PATENT APPLICATION

This application claims the benefit of Korean Patent Application No. 10-2008-0045072, filed on May 15, 2008, in the Korean Intellectual Property Office, the disclosure of which is incorporated by reference herein in its entirety.

FIELD OF THE INVENTION

Embodiments of the present invention relate to methods of forming a material layer and methods of fabricating a memory device including the material layer formed according to the methods described herein. Embodiments of the present invention more particularly relate to methods of forming a material layer and methods of fabricating a memory device whereby a via hole with a small diameter can be filled with the material layer with minimal formation, if any, of a void or a seam.

BACKGROUND

The main types of memory that are currently widely in use are dynamic random access memory (DRAM) and flash memories. DRAMs are volatile memories and consume a large amount of power at least because they are periodically refreshed. Flash memories are non-volatile memories but perform write operations at low speed and are typically limited in the number of rewrite operations they can perform.

In order to overcome these problems, next-generation memories including phase-change random access memory (PRAM), magnetoresistive random access memory (MRAM), and ferro-electric random access memory (FRAM) are being developed and are receiving much attention.

These next-generation memories are generally able to memorize information by a change in resistance according to a phase change, the control of electron spins, and the control of polarization of a ferroelectric material. In order to fabricate such memories, materials having these features are generally formed at a predetermined location on a device. Recently, research has been conducted into memory devices having a confined structure in order to consume a small amount of power and displaying good performance while maintaining the unique characteristics of these materials Confined-structure memory devices denote memory devices in which via holes are formed within insulation layers and filled with materials having such features as described above. These materials may be formed by chemical vapor deposition (CVD). However, it is usually difficult to fabricate confined-structure memory devices having good performance by using CVD.

In other words, these materials are deposited in a crystalline structure at a high temperature using CVD. FIG. 1A is a conceptual diagram illustrating voids formed when a material layer is formed within a via hole according to the conventional art. Referring to FIG. 1A, since the material layer is formed by depositing the material in a polycrystalline structure, a plurality of voids 20 may be formed within a via hole 10. Formation of the voids 20 may result in the manufacture of defective memory devices. This problem can be seen from plugs formed by CVD as illustrated in FIG. 1B. Arrows in FIG. 1B indicate plugs having voids formed therein.

Accordingly, a method of depositing a material having a memorization characteristic with limited formation of voids within a via hole is desired.

SUMMARY

Embodiments of the present invention provide methods of forming a material layer and methods of fabricating a reliable memory device using a material layer formed using the methods described herein, whereby a via hole with a small diameter can be filled with the material layer with limited formation of voids or seams. Additionally, embodiments of the present invention provide methods of forming a material layer by chemically adsorbing metal atoms to a substrate having anions formed on the surface thereof, and a method of fabricating a memory device by using the material layer forming method. Accordingly, a via hole with a small diameter can be filled with a material layer without forming voids or seams.

According to embodiments of the present invention, there is provided a method of forming a material layer, the method including a first cycle and a second cycle of material formation. The first cycle includes chemically adsorbing a pivotal element of a first precursor onto a substrate surface by using one of the compounds defined by Chemical Formulas 1 through 3 (shown below) as the first precursor; reacting the chemically adsorbed pivotal element of the first precursor with a reaction gas comprising a compound defined by Chemical Formula 4 (shown below); and chemically adsorbing a pivotal element of a second precursor onto the substrate surface by using one of the compounds defined by Chemical Formulas 1 through 3 (shown below) as the second precursor, the second precursor having a different pivotal element from the first precursor. The second cycle includes chemically adsorbing the pivotal element of the first precursor; and chemically adsorbing the pivotal element of the second precursor:

$$M_1 R_1 R_2 R_3 R_4 \qquad \text{<Chemical Formula 1>}$$

$$M_2 R_5 R_6 R_7 \qquad \text{<Chemical Formula 2>}$$

$$M_3 R_8 R_9 \qquad \text{<Chemical Formula 3>}$$

where a pivotal element $M_1$ is one of Ge, Si, Sn, Ga, In, and Ti, a pivotal element $M_2$ is one of Sb, As, Bi, Ga, and In, a pivotal element $M_3$ is one of Te and Se; and $R_1$ through $R_9$ are each independently a hydrogen, a methyl group or a branched hydrocarbon chain of 2 to 5 carbons or two of $R_1$ through $R_4$, two of $R_5$ through $R_7$, or a pair of $R_8$ and $R_9$ are connected to each other directly or via a hydrocarbylene group of 2 to 6 carbons so as to form a homo or hetero ring-shaped hydrocarbon, wherein a backbone of the branched hydrocarbon chain optionally comprises at least one of O, N, S, P, Si, Te, Sb, Se, Sn, Bi, and In, and hydrogen atoms of the branched hydrocarbon chain are unsubstituted or substituted with one selected from the group consisting of an alkyl group of 1 to 10 carbons, an allyl group of 3 to 10 carbons, a vinyl group of 2 to 10 carbons, an amine group, a halogen group, a cyano group, and an aryl group of 6 to 10 carbons;

$$R—X \qquad \text{<Chemical Formula 4>}$$

where X denotes one of F, Cl, Br, and I, and R denotes one of hydrogen, an alkyl group of 1 to 10 carbons, an allyl group of 3 to 10 carbons, a vinyl group of 2 to 10 carbons, an amine group, a cyano group, an aryl group of 6 to 10 carbons, and a halogen group that is the same as X.

According to other embodiments of the present invention, there is provided a method of fabricating a phase-change memory device, the method including forming a first electrode on a substrate; forming an insulation layer on the substrate, the insulation layer comprising a via hole through which the first electrode is exposed; and forming a phase-change layer within the via hole, wherein forming the phase-change layer within the via hole includes a first cycle and a second cycle. The first cycle includes chemically adsorbing a pivotal element of a first precursor onto a surface of the substrate by using one of the compounds defined by Chemical Formulas 1 through 3 as the first precursor; reacting the chemically adsorbed pivotal element of the first precursor with a reaction gas comprising a compound defined by Chemical Formula 4; and chemically adsorbing a pivotal element of a second precursor onto a surface of the substrate by using one of the compounds defined by Chemical Formulas 1 through 3 as the second precursor, the second precursor having a different pivotal element from the first precursor. The second cycle includes chemically adsorbing the pivotal element of the first precursor; and chemically adsorbing the pivotal element of the second precursor.

According to other embodiments of the present invention, there is provided a method of forming a material layer, the method including a first cycle and a second cycle. The first cycle includes chemically adsorbing a pivotal element of a first precursor onto a substrate surface by using one of the compounds defined by Chemical Formulas 6 through 8 (shown below) as the first precursor; reacting the pivotal element of the first precursor with a reaction gas comprising a compound defined by Chemical Formula 4; chemically adsorbing a pivotal element of a second precursor onto the substrate surface by using one of the compounds defined by Chemical Formulas 6 through 8 (shown below) as the second precursor, the second precursor having a different pivotal element from the first precursor; and chemically adsorbing a pivotal element of a third precursor onto the substrate surface by using one of the compounds defined by Chemical Formulas 6 through 8 as the third precursor, the third precursor having a different pivotal element from the first and second precursors. The second cycle includes chemically adsorbing the pivotal element of the first precursor; chemically adsorbing the pivotal element of the second precursor; and chemically adsorbing the pivotal element of the third precursor:

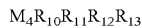  $M_4R_{10}R_{11}R_{12}R_{13}$  <Chemical Formula 6>

  $M_5R_{14}R_{15}R_6$  <Chemical Formula 7>

  $M_6R_{17}R_{18}$  <Chemical Formula 8> where a pivotal element $M_4$ is one of Pb, Ti, and Zr, a pivotal element $M_5$ is one of Bi, Nb, Ta, and La, and a pivotal element $M_6$ is one of Sr and Ba; and $R_{10}$ through $R_{18}$ are each independently a hydrogen, a methyl group or a branched hydrocarbon chain of 2 to 5 carbons or two of $R_{10}$ through $R_{13}$, two of $R_{14}$ through $R_{16}$, or a pair of $R_{17}$ and $R_{18}$ are connected to each other directly or via a hydrocarbylene group of 2 to 6 carbons so as to form a homo or hetero ring-shaped hydrocarbon, wherein a backbone of the branched hydrocarbon chain optionally comprises at least one of O, N, S, P, Si, Te, Sb, Se, Sn, Bi, and In, and hydrogen atoms of the branched hydrocarbon chain are unsubstituted or substituted with one group selected from the group consisting of an alkyl group of 1 to 10 carbons, an allyl group of 3 to 10 carbons, a vinyl group of 2 to 10 carbons, an amine group, a halogen group, a cyano group, and an aryl group of 6 to 10 carbons.

According to other embodiments of the present invention, there is provided a method of fabricating a ferroelectric memory device, the method including forming a first electrode on a substrate; forming an insulation layer on the substrate, the insulation layer comprising a via hole through which the first electrode is exposed; and forming a ferroelectric layer within the via hole, wherein forming the ferroelectric layer within the via hole includes a first cycle and a second cycle. The first cycle includes chemically adsorbing a pivotal element of a first precursor onto a surface of the substrate by using one of the compounds defined by Chemical Formulas 6 through 8 as the first precursor; reacting the pivotal element of the first precursor with a reaction gas comprising a compound defined by Chemical Formula 4; chemically adsorbing a pivotal element of a second precursor onto the surface of the substrate by using one of the compounds defined by Chemical Formulas 6 through 8 as the second precursor, the second precursor having a different pivotal element from the first precursor; and chemically adsorbing a pivotal element of a third precursor onto the surface of the substrate by using one of the compounds defined by Chemical Formulas 6 through 8 as the third precursor, the third precursor having a different pivotal element from the first and second precursors. The second cycle includes chemically adsorbing the pivotal element of the first precursor; chemically adsorbing the pivotal element of the second precursor; and chemically adsorbing the pivotal element of the third precursor.

According to other embodiments of the present invention, there is provided a method of forming a material layer, the method including a first cycle and a second cycle. The first cycle includes chemically adsorbing a pivotal element of a first precursor onto a surface of a substrate by using one of an Fe precursor, a Co precursor, an Ni precursor, an Mn precursor, and a Pt precursor as the first precursor; reacting the pivotal element of the first precursor with a reaction gas comprising the compound defined by Chemical Formula 4; and chemically adsorbing a pivotal element of a second precursor onto the surface of the substrate by using one of the Fe precursor, the Co precursor, the Ni precursor, the Mn precursor, and the Pt precursor as the second precursor, the second precursor having a different pivotal element from the first precursor. The second cycle includes chemically adsorbing the pivotal element of the first precursor; and chemically adsorbing the pivotal element of the second precursor.

According to other embodiments of the present invention, there is provided a method of fabricating a magnetoresistive memory device, the method including forming a first electrode on a substrate; forming an insulation layer on the substrate, the insulation layer comprising a via hole through which the first electrode is exposed; and forming a magnetoresistive layer within the via hole, wherein the forming of the magnetoresistive layer within the via hole includes a first cycle and a second cycle. The first cycle includes chemically adsorbing a pivotal element of a first precursor onto a surface of the substrate by using one of an Fe precursor, a Co precursor, an Ni precursor, an Mn precursor, and a Pt precursor as the first precursor; reacting the pivotal element of the first precursor with a reaction gas comprising the compound defined by Chemical Formula 4 below; and chemically adsorbing a pivotal element of a second precursor onto the surface of the substrate by using one of the Fe precursor, the Co precursor, the Ni precursor, the Mn precursor, and the Pt precursor as the second precursor, the second precursor having a different pivotal element from the first precursor. The second cycle includes chemically adsorbing the pivotal element of the first precursor; and chemically adsorbing the pivotal element of the second precursor.

In a material layer forming method and a memory device forming method according to embodiments of the present invention, a via hole with a small diameter can be filled with a material layer with minimal formation of voids or seams. Thus, a reliable memory device can be obtained.

BRIEF DESCRIPTION OF THE DRAWINGS

The above and other features and advantages of the present invention will become more apparent by describing in detail exemplary embodiments thereof with reference to the attached drawings described below.

DETAILED DESCRIPTION

Figure 1A:
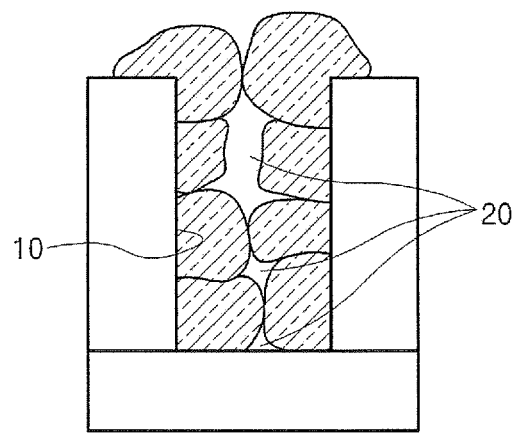
FIG. 1A is a conceptual diagram illustrating voids formed when a material layer is formed within a via hole according to the conventional art.
Figure 1B:
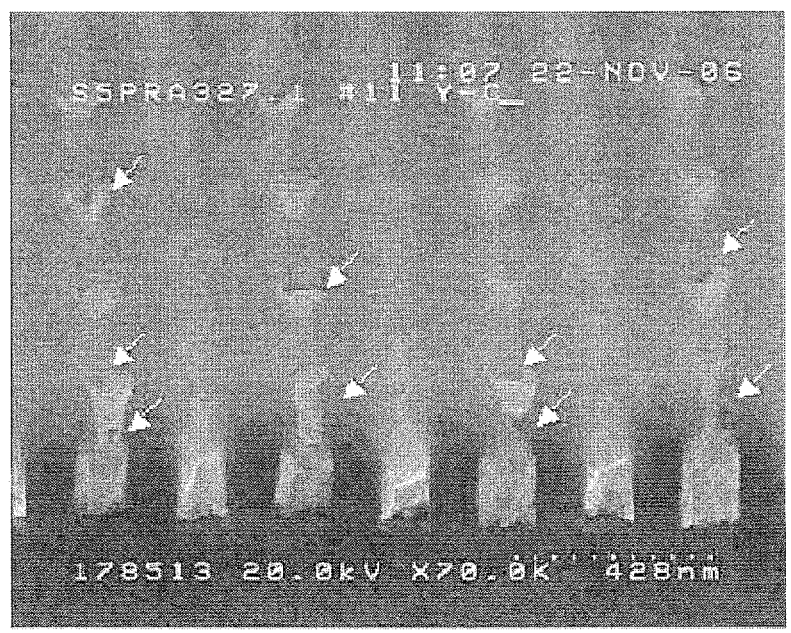
FIG. 1B is a transmission electron microscopic (TEM) image illustrating voids formed when a material layer is formed within a via hole according to the conventional art.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the present invention to those skilled in the art. Like reference numerals denote like elements throughout. Various elements and regions illustrated in the drawings are schematic in nature. Thus, the inventive concept should not be limited to relative sizes or intervals illustrated in the drawings. It will also be understood that when a layer is referred to as being "on" another layer or semiconductor chip, it can be directly on the other layer or semiconductor chip, or intervening layers may also be present. Moreover, it will be understood that steps comprising the methods provided herein can be performed independently or at least two steps can be combined.

In particular, the inventive concept provides a method of forming a material layer. The material layer may be a phase-change material layer of a phase-change memory device or a ferromagnetic material layer of an MRAM or an FRAM.

Method of Forming a Material Layer (I)

First, a substrate on which a material is to be deposited is loaded within a reaction chamber. The substrate may include a dielectric film formed of silicon oxide, titanium oxide, aluminum oxide, zirconium oxide or hafnium oxide, a conductive film formed of titanium, titanium nitride, aluminum, tantalum, tantalum nitride, or titanium aluminum nitride, or a semiconductor film formed of silicon or silicon carbide. For example, unit devices, such as transistors, required to form a semiconductor device, may be formed on a silicon substrate, and an interlayer dielectric film covering the unit devices may be formed on the silicon substrate. Bottom electrodes electrically connected to the unit devices may be formed on the silicon substrate and covered with the interlayer dielectric film so as to be partially exposed through via holes formed in the interlayer dielectric film.

The reaction chamber may be a cold wall type or a hot wall type reaction chamber. A cold wall type reaction chamber may include a substrate stage equipped with hot wires and a shower head located on the substrate stage. The substrate may be arranged on the substrate stage. The cold wall type reaction chamber may be a single type reaction chamber. In the alternative, a hot wall type reaction chamber includes hot wires within a wall thereof. A plurality of substrates may be vertically arranged within the hot wall type reaction chamber. The hot wall reaction chamber may be a vertical and batch type reaction chamber.

The first method of forming the material layer may be divided into a first cycle and a second cycle.

The first cycle may be performed only once during the formation of the material layer. Alternatively, the first cycle may be performed consecutively or nonconsecutively two to 10 times during the formation of the material layer. The first cycle includes chemically adsorbing a pivotal element of a first precursor onto a surface of a substrate by using one of the compounds defined by Chemical Formulas 1 through 3 as the first precursor reacting the pivotal element of the first precursor with a reaction gas including a compound defined by Chemical Formula 4, and chemically adsorbing a pivotal element of a second precursor on the surface of the substrate by using one of the compounds defined by Chemical Formulas 1 through 3 as the second precursor, the second precursor having a different pivotal element from the first precursor:

$M_1 R_1 R_2 R_3 R_4$                                                <Chemical Formula 1>

$M_2 R_5 R_6 R_7$                                                    <Chemical Formula 2>

$M_3 R_8 R_9$                                                        <Chemical Formula 3> where a pivotal element $M_1$ is one of Ge, Si, Sn, Ga, In, and Ti, a pivotal element $M_2$ is one of Sb, As, Bi, Ga, and In, a pivotal element $M_3$ is Te or Se; and $R_1$ through $R_9$ are each independently a hydrogen, a methyl group or a branched hydrocarbon chain of 2 to 5 carbons or two of $R_1$ through $R_4$, two of $R_5$ through $R_7$, or a pair of $R_8$ and $R_9$ may be connected to each other directly or via a hydrocarbylene group of 2 to 6 carbons so as to form a homo or hetero ring-shaped hydrocarbon. In the branched hydrocarbon chain, a backbone may optionally include at least one of O, N, S, P, Si, Te, Sb, Se, Sn, Bi, and In, and hydrogen atoms may be unsubstituted or may be substituted with one group selected from the group consisting of an alkyl group of 1 to 10 carbons, an allyl group of 3 to 10 carbons, a vinyl group of 2 to 10 carbons, an amine group, a halogen group, a cyano group, and an aryl group of 6 to 10 carbons.

R—X                                                         <Chemical Formula 4> where X denotes F, Cl, Br, or I, and R denotes hydrogen, an alkyl group of 1 to 10 carbons, an allyl group of 3 to 10 carbons, a vinyl group of 2 to 10 carbons, an amine group, a cyano group, an aryl group of 6 to 10 carbons, or a halogen group that is the same as X.

The second cycle may be repeated several times while the material layer is being formed. Typically, the second cycle may be repeated about 30 to about 250 times. The second cycle may include chemically adsorbing the pivotal element of the first precursor and chemically adsorbing the pivotal element of the second precursor.

The substrate surface onto which the pivotal element of the first precursor is chemically adsorbed during the first cycle may be the surface of the substrate on which the unit devices of a semiconductor device are formed and/or the surface of the interlayer dielectric film. Alternatively, the substrate surface may be the surface of a part of a material layer formed by a repetition of the first and/or second cycles.

The first cycle will now be described in more detail. Although the first cycle is described as being performed using atomic layer deposition (ALD), the inventive concept is not limited to ALD. A gas pulsing diagram of the first cycle is illustrated in FIG. 2.

Figure 2:
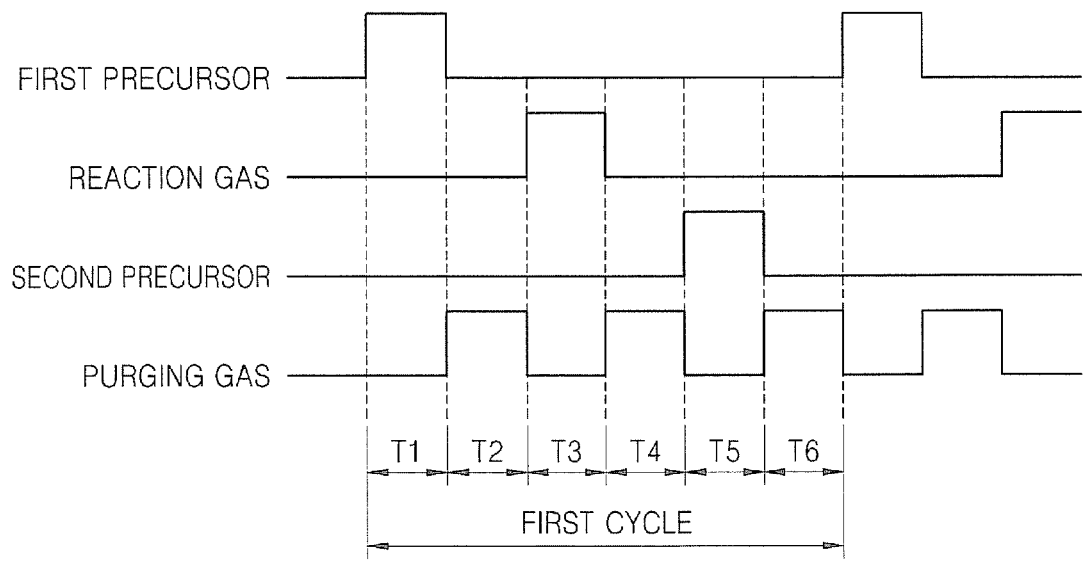
FIGS. 2 and 3 are gas pulsing diagrams for a first cycle and a second cycle, respectively, in a method of forming a material layer, according to an embodiment of the inventive concept.

Referring to FIG. 2, a first precursor may be injected into a reaction chamber at a pressure of about 1 torr to about 10 torr for a period of time T1 while the temperature of the reaction chamber is about 200° C. to about 400° C. The period of time T1 may be about 0.5 to about 10 seconds. Functional groups are separated from pivotal elements of the first precursor by the temperature of the reaction chamber, and the pivotal elements are attached to the surface of a substrate. Pivotal elements directly coupled with the substrate among the pivotal elements of the first precursor are chemically adsorbed onto the surface of the substrate, whereas pivotal elements not directly coupled with the surface of the substrate are physically adsorbed onto the surface of the substrate.

Thereafter, the injection of the first precursor is interrupted, and a purging gas is supplied into the reaction chamber for a period of time T2, so that a not-yet-adsorbed portion of the first precursor and the physically adsorbed pivotal elements thereof are removed from the reaction chamber. The purging gas may be an inert gas such as argon (Ar), helium (He), nitrogen ($N_2$), or hydrogen ($H_2$).

Next, for a period of time T3, a reaction gas of Chemical Formula 4 may be injected into the reaction chamber at a pressure of about 1 torr to about 10 torr while the temperature of the reaction chamber is about 200° C. to about 400° C. The period of time T3 may be about 0.5 to 10 seconds. The reaction gas reacts with the pivotal elements of the first precursor chemically adsorbed to the surface of the substrate, and the surface of the substrate assumes a negative charge due to the reaction of the reaction gas with the chemically adsorbed pivotal elements of the first precursor.

Thereafter, similar to the period of time T2, the purging gas may be supplied during a period of time T4 in order to remove unnecessary gases from the reaction chamber.

Then, during a period of time T5, the second precursor may be supplied into the reaction chamber and maintained at a pressure of about 1 to about 10 torr while the temperature of the reaction chamber is about 200° C. to about 400° C. The period of time T5 may be about 0.5 to about 10 seconds. Functional groups are separated from pivotal elements of the second precursor by the temperature of the reaction chamber, and the pivotal elements are attached to the surface of the substrate. Pivotal elements directly coupled with the substrate among the pivotal elements of the second precursor are chemically adsorbed onto the surface of the substrate, whereas pivotal elements not directly coupled with the substrate are physically adsorbed onto the surface of the substrate.

During a period of time T6, which is the final stage of the first cycle, the purging gas is supplied again in order to remove unnecessary gases, for example, a not-yet-adsorbed portion of the second precursor and the physically adsorbed pivotal elements thereof, from the reaction chamber.

The first cycle including the above-described stages is an initial cycle for forming a material layer, and may be performed only once during the formation of the material layer or may be performed two to 10 times or more. The first cycle may be consecutively repeated or performed as occasion demands in the middle of repetition of the second cycle, which will be described later.

Each of the first and second precursors and the reaction gas may be injected in an amount of about 10 sccm to about 1000 sccm for about 0.5 to 60 seconds according to the size of the reaction chamber.

The second cycle will now be described in greater detail. Although the second cycle is described as being performed using ALD, the inventive concept is not limited to ALD. A gas pulsing diagram of the second cycle is illustrated in FIG. 3.

Figure 3:
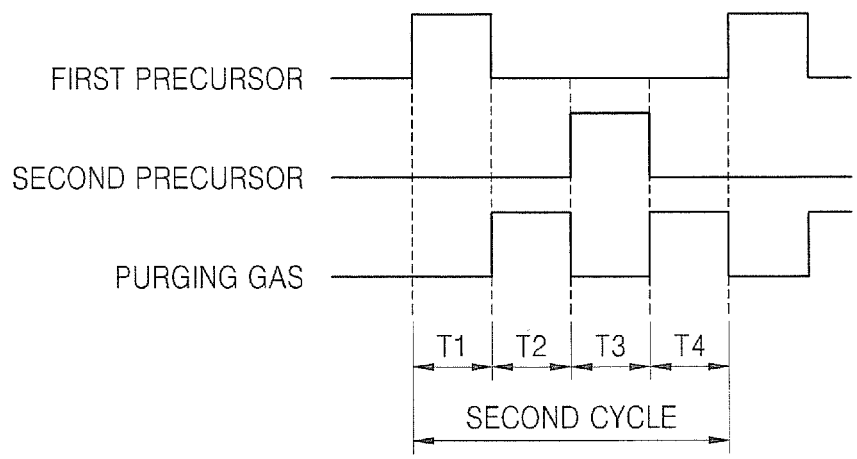

Referring to FIG. 3, a first precursor may be injected into a reaction chamber at a pressure of about 1 torr to about 10 torr for a period of time T1 while the reaction chamber may have a temperature of about 200° C. to about 400° C. The period of time T1 may be about 0.5 to about 10 seconds. Functional groups are separated from pivotal elements of the first precursor by the temperature of the reaction chamber, and the pivotal elements are attached to the surface of the substrate. Pivotal elements directly coupled with the substrate among the pivotal elements of the first precursor are chemically adsorbed onto the surface of the substrate, whereas pivotal elements not directly coupled with the substrate are physically adsorbed onto the substrate. As described above, the substrate may be the substrate on which the unit devices required to form a semiconductor device are formed and/or the interlayer dielectric film. Alternatively, the substrate may be a part of a material layer formed by a repetition of the first and/or second cycles.

Thereafter, the injection of the first precursor is interrupted, and a purging gas is supplied to the reaction chamber for a period of T2, so that a not-yet-adsorbed portion of the first precursor and the physically adsorbed pivotal elements thereof are removed from the reaction chamber. The purging gas may be an inert gas such as argon (Ar), helium (He), nitrogen ($N_2$), or hydrogen ($H_2$).

During a period of time T3, the second precursor may be supplied into the reaction chamber at a pressure of about 1 torr to about 10 torr while the reaction chamber may have a temperature of about 200° C. to about 400° C. The period of time T3 may be about 0.5 to about 10 seconds. Functional groups are separated from pivotal elements of the second precursor by the temperature of the reaction chamber, and the pivotal elements are attached onto the surface of the substrate. Pivotal elements directly coupled with the substrate among the pivotal elements of the second precursor are chemically adsorbed onto the surface of the substrate, whereas pivotal elements not directly coupled with the substrate are physically adsorbed onto the surface of the substrate.

During a period of time T4, which is the final stage of the second cycle, the purging gas is supplied again in order to remove unnecessary gases, for example, a not-yet-adsorbed portion of the second precursor and the physically adsorbed pivotal elements thereof, from the reaction chamber.

Figure 4:
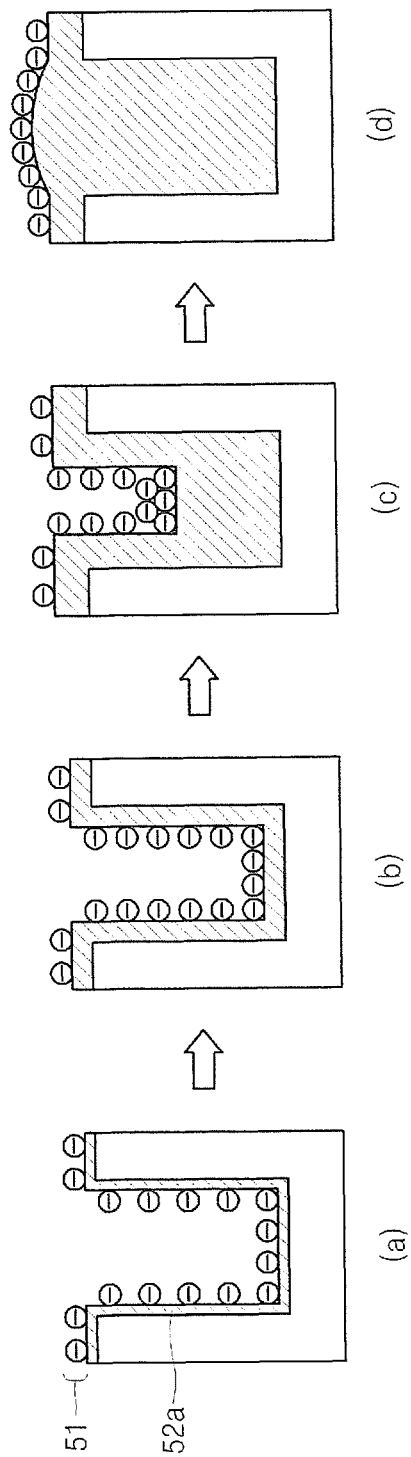
FIG. 4 is a conceptual diagram illustrating the principle of forming a material layer, according to an embodiment of the inventive concept.

FIG. 4 illustrates a well-known mechanism whereby a material layer 52a is formed on a substrate by repeating the first and second cycles.

Referring to FIG. 4(a), when a first precursor is chemically adsorbed onto the surface of the substrate, on which the material layer 52a is to be formed, and then reacts with a reaction gas including the compound of Chemical Formula 4, a layer 51 of charged atoms with a uniform density is formed on the surface of the substrate. As described above, the charged atoms may be halogen group elements and serve as a catalyst for chemically adsorbing pivotal elements in order to form the material layer 52a.

Referring to FIG. 4(b), in an initial stage of forming the material layer 52a, deposition rates for surfaces of a recessed region such as a via hole are nearly uniform. However, as the second cycle is repeated, a rate at which the density of charged atoms increases is higher on a bottom surface than on sidewalls. Consequently, the lower surface grows significantly faster than the sidewall.

As a result, the recessed region may be evenly filled without voids or seams as illustrated in FIG. 4(c). Finally, a recessed region filled without defects may be obtained as illustrated in FIG. 4(d). This growth is highly affected by the charged atoms which serve as a catalyst. In some cases, in the middle of a repetition of the second cycle, the first cycle may be performed as occasion demands in order to increase such catalysis.

The compound of Chemical Formula 1 may be a cyclic compound of Chemical Formula 5 shown below, $Ge(CH_3)_4$, $Ge(C_2H_5)_4$, $Ge(i-C_3H_7)_4$, $Ge(n-C_3H_7)_4$, $Ge(i-C_4H_9)_4$, $Ge(t-C_4H_9)_4$, $Ge[N(CH_3)_2]_4$, $Ge[NH(CH_3)]_4$, $Ge[N(CH_3)(C_2H_5)]_4$, $Ge[NH(C_2H_5)]_4$, $Ge[N(C_2H_5)_2]_4$, $Ge(N(i-C_3H_7)_2)_4$, $Ge[N(Si(CH_3)_3)_2]_4$, $Si(CH_3)_4$, $Si(C_2H_5)_4$, $Si(i-C_3H_7)_4$, $Si(n-C_3H_7)_4$, $Si(i-C_4H_9)_4$, $Si(t-C_4H_9)_4$, $Si[N(CH_3)_2]_4$, $Si[NH(CH_3)]_4$, $Si[N(CH_3)(C_2H_5)]_4$, $Si[NH(C_2H_5)]_4$, $Si[N(C_2H_5)_2]_4$, $Si(N(i-C_3H_7)_2)_4$, $Si[N(Si(CH_3)_3)_2]_4$, $Sn(CH_3)_4$, $Sn(C_2H_5)_4$, $Sn(i-C_3H_7)_4$, $Sn(n-C_3H_7)_4$, $Sn(i-C_4H_9)_4$, $Sn(t-C_4H_9)_4$, $Sn[N(CH_3)_2]_4$, $Sn[NH(CH_3)]_4$, $Sn[N(CH_3)(C_2H_5)]_4$, $Sn[NH(C_2H_5)]_4$, $Sn[N(C_2H_5)_2]_4$, $Sn(N(i-C_3H_7)_2)_4$, $Sn[N(Si(CH_3)_3)_2]_4$, $Ga(CH_3)_4$, $Ga(C_2H_5)_4$, $Ga(i-C_3H_7)_4$, $Ga(n-C_3H_7)_4$, $Ga(i-C_4H_9)_4$, $Ga(t-C_4H_9)_4$, $Ga[N(CH_3)_2]_4$, $Ga[NH(CH_3)]_4$, $Ga[N(CH_3)(C_2H_5)]_4$, $Ga[NH(C_2H_5)]_4$, $Ga[N(C_2H_5)_2]_4$, $Ga(N(i-C_3H_7)_2)_4$, $Ga[N(Si(CH_3)_3)_2]_4$, $In(CH_3)_4$, $In(C_2H_5)_4$, $In(i-C_3H_7)_4$, $In(n-C_3H_7)_4$, $In(i-C_4H_9)_4$, $In(t-C_4H_9)_4$, $In[N(CH_3)_2]_4$, $In[NH(CH_3)]_4$, $In[N(CH_3)(C_2H_5)]_4$, $In[NH(C_2H_5)]_4$, $In[N(C_2H_5)_2]_4$, $In(N(i-C_3H_7)_2)_4$, or $In[N(Si(CH_3)_3)_2]_4$.

The compound of Chemical Formula 2 may be $Sb(CH_3)_3$, $Sb[CH(CH_3)_2]_3$, $Sb[N(CH_3)_2]_3$, $Sb(C_2H_5)_3$, $Sb(i-C_3H_7)_3$, $Sb(n-C_3H_7)_3$, $Sb(i-C_4H_9)_3$,— $Sb(t-C_4H_9)_3$, $Sb(N(CH_3)(C_2H_5))_3$, $Sb(N(C_2H_5)_2)_3$, $Sb(N(i-C_3H_7)_2)_3$, $Sb[N(Si(CH_3)_3)_2]_3$, $Bi(CH_3)_3$, $Bi[CH(CH_3)_2]_3$, $Bi[N(CH_3)_2]_3$, $Bi(C_2H_5)_3$, $Bi(i-C_3H_7)_3$, $Bi(n-C_3H_7)_3$, $Bi(i-C_4H_9)_3$, $Bi(t-C_4H_9)_3$, $Bi(N(CH_3)(C_2H_5))_3$, $Bi(N(C_2H_5)_2)_3$, $Bi(N(i-C_3H_7)_2)_3$, $Bi[N(Si(CH_3)_3)_2]_3$, $As(CH_3)_3$, $As[CH(CH_3)_2]_3$, $As[N(CH_3)_2]_3$, $As(C_2H_5)_3$, $As(i-C_3H_7)_3$, $As(n-C_3H_7)_3$, $As(i-C_4H_9)_3$, $As(t-C_4H_9)_3$, $As(N(CH_3)(C_2H_5))_3$, $As(N(C_2H_5)_2)_3$, $As(N(i-C_3H_7)_2)_3$, $As[N(Si(CH_3)_3)_2]_3$, $Ga(CH_3)_3$, $Ga[CH(CH_3)_2]_3$, $Ga[N(CH_3)_2]_3$, $Ga(C_2H_5)_3$, $Ga(i-C_3H_7)_3$, $Ga(n-C_3H_7)_3$, $Ga(i-C_4H_9)_3$, $Ga(t-C_4H_9)_3$, $Ga(N(CH_3)(C_2H_5))_3$, $Ga(N(C_2H_5)_2)_3$, $Ga(N(i-C_3H_7)_2)_3$, $Ga[N(Si(CH_3)_3)_2]_3$, $In(CH_3)_3$, $In[CH(CH_3)_2]_3$, $In[N(CH_3)_2]_3$, $In(C_2H_5)_3$, $In(i-C_3H_7)_3$, $In(n-C_3H_7)_3$, $In(i-C_4H_9)_3$, $In(t-C_4H_9)_3$, $In(N(CH_3)(C_2H_5))_3$, $In(N(C_2H_5)_2)_3$, $In(N(i-C_3H_7)_2)_3$, or $In[N(Si(CH_3)_3)_2]_3$.

The compound of Chemical Formula 3 may be $Te(CH_3)_2$, $Te[CH(CH_3)_2]_2$, $Te[C(CH_3)_3]_2$, $Te(C_2H_5)_2$, $Te(n-C_3H_7)_2$, $Te(i-C_3H_7)_2$, $Te(t-C_4H_9)_2$, $Te(i-C_4H_9)_2$, $Te(CH=CH_2)_2$, $Te(CH_2CH=CH_2)_2$, $Te[N(Si(CH_3)_3)_2]_2$ $Se(CH_3)_2$, $Se[CH(CH_3)_2]_2$, $Se[C(CH_3)_3]_2$, $Se(C_2H_5)_2$, $Se(n-C_3H_7)_2$, $Se(i-C_3H_7)_2$, $Se(t-C_4H_9)_2$, $Se(i-C_4H_9)_2$, $Se(CH=CH_2)_2$, $Se(CH_2CH=CH_2)_2$, or $Se[N(Si(CH_3)_3)_2]_2$.

However, as understood by one skilled in the art, the compounds of Chemical Formulas 1 through 3 are not to be limited to the aforementioned compounds.

Chemical Formula 5

The compound of Chemical Formula 4 may be $CH_3F$, $CH_3Cl$, $CH_3Br$, $CH_3I$, HF, HCl, HBr, HI, $F_2$, $Cl_2$, $Br_2$, $I_2$, or the like, but is not limited thereto.

As described above, the pivotal element of the first precursor can be different from that of the second precursor. In particular, a group number of the pivotal element of the first precursor may be different from the group number of the pivotal element of the second precursor. Consequently, the material layer to be deposited may be GeTe, SbTe, or InSe.

Optionally, at least one gas selected from the group consisting of $C_2H_2$, $NH_3$, $SiH_4$, and $O_2$ may exist within the reaction chamber during the chemical adsorption. In this case, an effect whereby the material layer is doped with elements such as C, N, Si, and O may be obtained.

Optionally, the first cycle may further include chemically adsorbing the pivotal element of the third precursor by using one of the compounds of Chemical Formulas 1 through 3 as the third precursor, after reacting to the chemically adsorbed pivotal element of the first precursor with the reaction gas including the compound of Chemical Formula 4.

Optionally, the second cycle may also further include chemically adsorbing the pivotal element of the third precursor by using one of the compounds of Chemical Formulas 1 through 3 as the third precursor.

If the first and second cycles further include chemically adsorbing the pivotal element of the third precursor, the pivotal element of the third precursor may be chemically adsorbed by the provision of the third precursor, and a not-yet-chemically adsorbed portion of the third precursor and physically adsorbed pivotal elements may be removed from the reaction chamber by the provision of a purging gas. In particular, a method and/or a condition of supplying the third precursor and a method and/or a condition of supplying the purging gas may be similar to methods and/or conditions of supplying other precursors and other purging gases described above.

The pivotal element of the third precursor may be different from that of the first precursor. Alternatively, the pivotal element of the third precursor may also be different from that of the second precursor. Alternatively, the pivotal element of the third precursor may be different from those of the first and second precursors. Alternatively, the pivotal elements of the first through third precursors may all have different group numbers.

The material layer obtained using the first through third precursors as described above may be formed of a material selected from GeSbTe, GeTeAs, SbTeSn, SeTeSn, GeTeSe, SbSeBi, GeBiTe, GeTeTi, GaTeSe, and InSbTe.

Method of Forming a Material Layer (II)

The further method of forming the material layer may comprise a first cycle and a second cycle.

The first cycle may be performed only once during the formation of the material layer. Alternatively, the first cycle may be performed consecutively or nonconsecutively two to 10 times or more during the formation of the material layer. The first cycle includes chemically adsorbing a pivotal element of a first precursor onto a substrate surface by using one of the compounds defined by Chemical Formulas 6 through 8 (shown below) as the first precursor; reacting the pivotal element of the first precursor with a reaction gas including a compound defined by Chemical Formula 4; an chemically adsorbing a pivotal element of a second precursor onto the substrate surface by using one of the compounds defined by Chemical Formulas 6 through 8 as the second precursor, the second precursor having a different pivotal element from the first precursor; and chemically adsorbing a pivotal element of a third precursor onto the substrate surface by using one of the compounds defined by Chemical Formulas 6 through 8 as the third precursor, the third precursor having a different pivotal element from the first and second precursors:

$M_4R_{10}R_{11}R_{12}R_{13}$ <Chemical Formula 6>

$M_5R_{14}R_{15}R_{16}$ <Chemical Formula 7>

$M_6R_{17}R_{18}$ <Chemical Formula 8> where a pivotal element $M_4$ is one of Pb, Ti, and Zr, a pivotal element $M_5$ is one of Bi, Nb, Ta, and La, and a pivotal element $M_6$ is Sr or B; and $R_{10}$ through $R_{18}$ are each independently a hydrogen, a methyl group or a branched hydrocarbon chain of 2 to 5 carbons or two of $R_{10}$ through $R_{13}$, two of $R_{14}$ through $R_{16}$, or a pair of $R_{17}$ and $R_{18}$ may be connected to each other directly or via a hydrocarbylene group of 2 to 6 carbons so as to form a homo or hetero ring-shaped hydrocarbon. In the branched hydrocarbon chain, a backbone may optionally include at least one of O, N, S, P, Si, Te, Sb, Se, Sn, Bi, and In, and hydrogen atoms may be unsubstituted or may be substituted with one group selected from an alkyl group of 1 to 10 carbons, an allyl group of 3 to 10 carbons, a vinyl group of 2 to 10 carbons, an amine group, a halogen group, a cyano group, and an aryl group of 6 to 10 carbons.

R—X <Chemical Formula 4> where X and R are the same as defined above.

The second cycle may be repeated several times while the material layer is formed. Typically, the second cycle may be repeated about 30 to about 250 times. The second cycle may include chemically adsorbing the pivotal element of the first precursor, chemically adsorbing the pivotal element of the second precursor, and chemically adsorbing the pivotal element of the third precursor.

The substrate surface onto which the pivotal element of the first precursor is chemically adsorbed during the first cycle may be the surface of the substrate on which the unit devices required to form a semiconductor device and/or the surface of the interlayer dielectric film. Alternatively, the substrate surface may be the surface of a part of a material layer formed by a repetition of the first and/or second cycles.

The first cycle will now be described in more detail. Although the first cycle is described as being performed using ALD, the inventive concept is not limited to ALD. A gas pulsing diagram of the first cycle is illustrated in FIG. 5.

Figure 5:
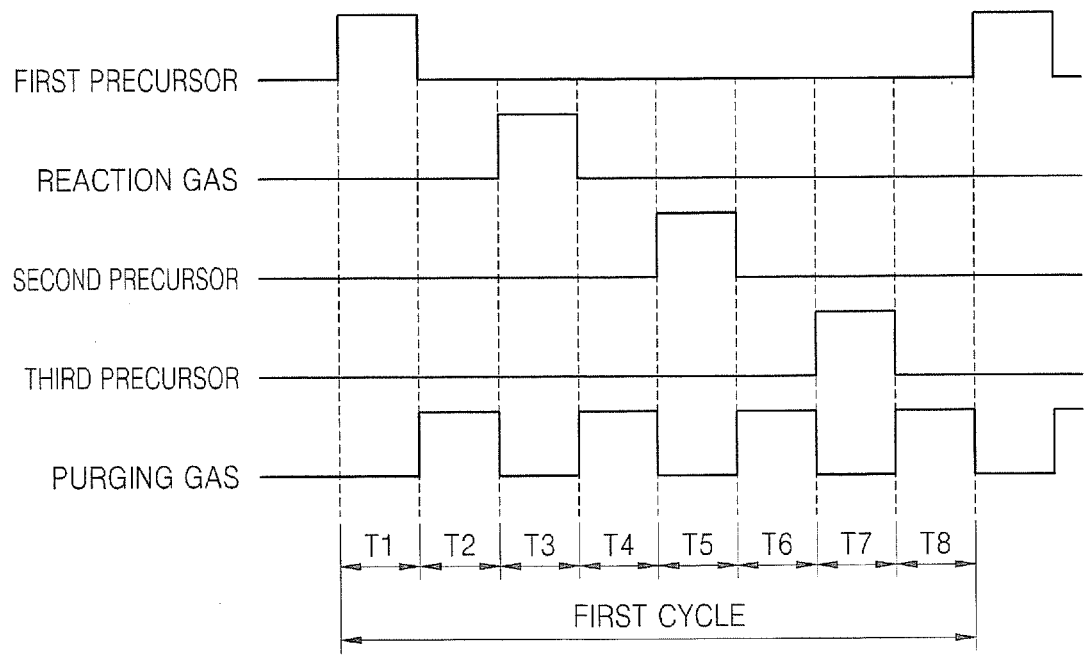
FIGS. 5 and 6 are gas pulsing diagrams for a first cycle and a second cycle, respectively, in a method of forming a material layer, according to another embodiment of the inventive concept.

Referring to FIG. 5, a first precursor may be injected into a reaction chamber at a pressure of about 1 torr to about 10 torr for a period of time T1 while the reaction chamber may have a temperature of about 200° C. to about 400° C. The period of time T1 may be about 0.5 to about 10 seconds. Functional groups are separated from pivotal elements of the first precursor by the temperature of the reaction chamber, and the pivotal elements are attached to the surface of a substrate. Pivotal elements directly coupled with the substrate among the pivotal elements of the first precursor are chemically adsorbed onto the surface of the substrate, whereas pivotal elements not directly coupled with the substrate are physically adsorbed onto the surface of the substrate.

Thereafter, the supply of the first precursor is interrupted, and a purging gas is supplied for a period of T2, so that a not-yet-adsorbed portion of the first precursor and the physically adsorbed pivotal elements thereof are removed from the reaction chamber. The purging gas may be an inert gas such as argon (Ar), helium (He), nitrogen ($N_2$), or hydrogen ($H_2$).

Next, for a period of time T3, a reaction gas of Chemical Formula 4 may be implemented into the reaction chamber at a pressure of about 1 torr to about 10 torr while the reaction chamber may have a temperature of about 200° C. to about 400° C. The period of time T3 may be about 0.5 to 10 seconds. The reaction gas reacts with the pivotal elements of the first precursor chemically adsorbed onto the surface of the substrate, and the surface of the substrate assumes a negative charge due to the reaction of the reaction gas with the chemically adsorbed pivotal elements of the first precursor.

Thereafter, similar to the period of time T2, the purging gas is supplied during a period of time T4 in order to remove unnecessary gases from the reaction chamber.

During a period of time T5, the second precursor may be supplied into the reaction chamber at a pressure of about 1 to about 10 torr while the reaction chamber may have a temperature of about 200° C. to about 400° C. The period of time T5 may be about 0.5 to about 10 seconds. Functional groups are separated from pivotal elements of the second precursor by the temperature of the reaction chamber, and the pivotal elements are attached to the surface of the substrate. Pivotal elements directly coupled with the substrate among the pivotal elements of the second precursor are chemically adsorbed onto the surface of the substrate, whereas pivotal elements not directly coupled with the substrate are physically adsorbed onto the surface of the substrate.

Thereafter, similar to the period of time T4, the purging gas is supplied during a period of time T6 in order to remove unnecessary gases from the reaction chamber.

During a period of time T7, the third precursor may be supplied into the reaction chamber at a pressure of about 1 torr to about 10 torr while the reaction chamber may have a temperature of about 200° C. to about 400° C. The period of time T7 may be about 0.5 to about 10 seconds. Functional groups are separated from pivotal elements of the third precursor by the temperature of the reaction chamber, and the pivotal elements are attached to the surface of the substrate. Pivotal elements directly coupled with the substrate among the pivotal elements of the third precursor are chemically adsorbed onto the surface of the substrate, whereas pivotal elements not directly coupled with the substrate are physically adsorbed onto the surface of the substrate.

During a period of time T8, which is the final stage of the first cycle, the purging gas is supplied again in order to remove unnecessary gases, for example, a not-yet-adsorbed portion of the first precursor and the physically adsorbed pivotal elements, from the reaction chamber.

The first cycle including the above-described stages is an initial cycle for forming a material layer, and may be preformed only once during the formation of the material layer or may be performed two to 10 times or more. The first cycle may be consecutively repeated or performed as occasion demands in the middle of repetition of the second cycle, which will be described later.

Each of the first, second, and third precursors and the reaction gas may be injected in an amount of about 10 sccm to about 1000 sccm for about 0.5 to 60 seconds according to the size of the reaction chamber.

The second cycle will now be described in greater detail. Although the second cycle is described as being performed using ALD, the inventive concept is not limited to ALD. A gas pulsing diagram of the second cycle is illustrated in FIG. 6.

Figure 6:
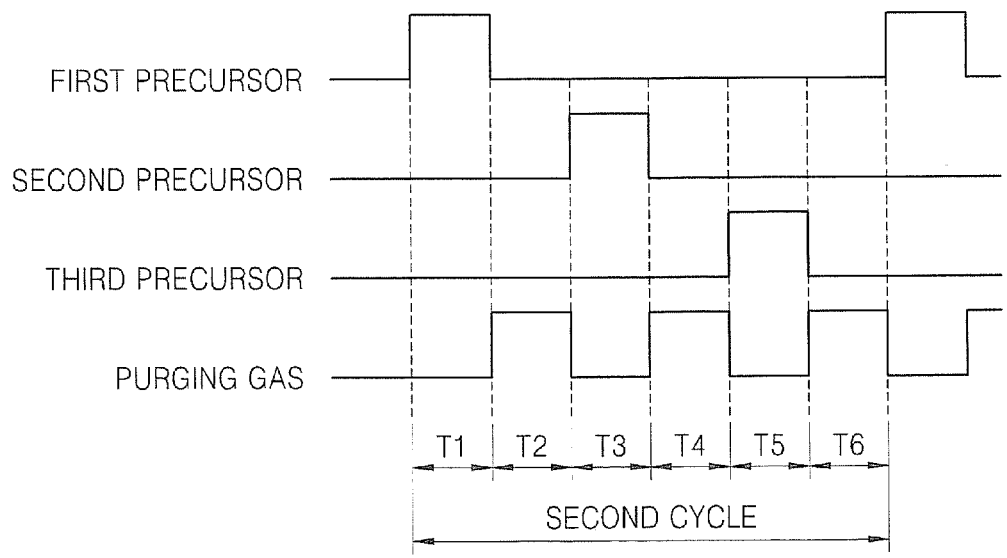

Referring to FIG. 6, a first precursor may be injected into a reaction chamber at a pressure of about 1 torr to about 10 torr for a period of time T1 while the reaction chamber may have a temperature of about 200° C. to about 400° C. The period of time T1 may be about 0.5 to about 10 seconds. Functional groups are separated from pivotal elements of the first precursor by the temperature of the reaction chamber, and the pivotal elements are attached to the surface of the substrate. Pivotal elements directly coupled with the substrate among the pivotal elements of the first precursor are chemically adsorbed onto the surface of the substrate, whereas pivotal elements not directly coupled with the substrate are physically adsorbed onto the surface of the substrate. As described above, the substrate may be the substrate on which the unit devices required to form a semiconductor device are formed and/or the interlayer dielectric film. Alternatively, the substrate may be a part of a material layer formed by a repetition of the first and/or second cycles.

Thereafter, the injection of the first precursor is interrupted, and a purging gas is supplied into the reaction chamber for a period of time T2, so that a not-yet-adsorbed portion of the first precursor and the physically adsorbed pivotal elements thereof are removed from the reaction chamber. The purging gas may be an inert gas such as argon (Ar), helium (He), nitrogen ($N_2$), or hydrogen ($H_2$).

During a period of time T3, the second precursor may be supplied into the reaction chamber at a pressure of about 1 torr to about 10 torr while the reaction chamber may have a temperature of about 200° C. to about 400° C. The period of time T3 may be about 0.5 to about 10 seconds. Functional groups are separated from pivotal elements of the second precursor by the temperature of the reaction chamber, and the pivotal elements are attached to the surface of the substrate. Pivotal elements directly coupled with the substrate among the pivotal elements of the second precursor are chemically adsorbed onto the surface of the substrate, whereas pivotal elements not directly coupled with the substrate are physically adsorbed onto the surface of the substrate.

Thereafter, similar to the period of time T2, the purging gas is supplied during a period of time T4 in order to remove unnecessary gases from the reaction chamber.

During a period of time T5, the third precursor may be supplied in the same way as that of supplying the second precursor, so as to chemically adsorb the pivotal elements of the third precursor.

During a period of time T6, which is the final stage of the second cycle, the purging gas is supplied again in order to remove unnecessary gases, for example, a not-yet-adsorbed portion of the third precursor and the physically adsorbed pivotal elements of the third precursor, from the reaction chamber.

A mechanism of this further method of forming a material layer by repeating the first and second cycles may be the same as that of the first method described above, and thus a detailed description thereof is not provided here.

The compound of Chemical Formula 4 may be $CH_3F$, $CH_3Cl$, $CH_3Br$, $CH_3I$, HF, HCl, HBr, HI, $F_2$, $Cl_2$, $Br_2$, $I_2$, or the like, but the inventive concept is not limited thereto.

The compound of Chemical Formula 6 may be one of Chemical Formulas 7 through 13 shown below. Alternatively, the compound of Chemical Formula 6 may be $Pb(TMHD)_2$, $Pb(TMHD)_2$-PMDT (where PMDT denotes pentamethyldiethylenetriamine), $Pb(METHD)_2$ (where METHD denotes methoxyethoxytetramethylheptanedionate), $Zr(DMAE)_4$, $Zr(METHD)_4$, $Zr(MPD)(METHD)_2$, $Zr[N(CH_3)_2]_4$, $Zr[N(C_2H_5)_2]_4$, $Zr(O-t-C_4H_9)_4$, $Zr(O-i-CH_3)_4$, $Zr(O-i-C_2H_5)_4$, $Zr(O-i-C_3H_7)_4$, $Ti(MPD)(METHD)2$, $Ti(DMAE)4$, $Ti[N(C_2H_5)_2]_4$, $Ti(O-t-C_4H_9)_4$, $Ti(O-i-CH_3)_4$, $Ti(O-i-C_2H_5)_4$, $Ti(O-i-C_3H_7)_4$, or the like, but the inventive concept is not limited thereto.

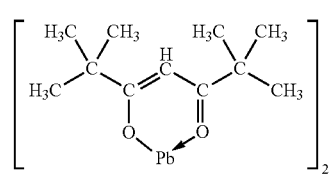

<Chemical Formula 7>

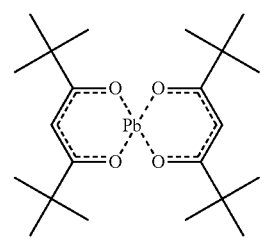

<Chemical Formula 8>

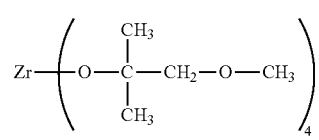

<Chemical Formula 9>

<Chemical Formula 10>

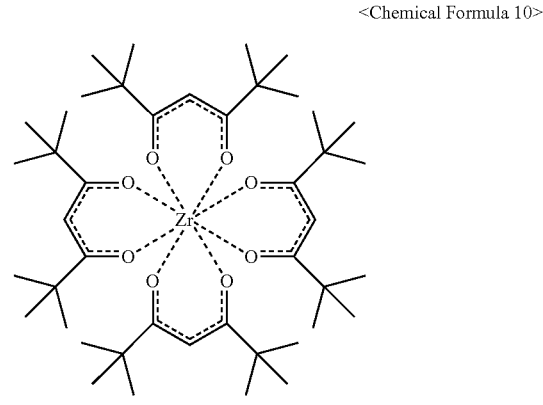

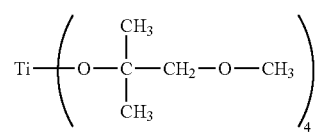

<Chemical Formula 11>

<Chemical Formula 12>

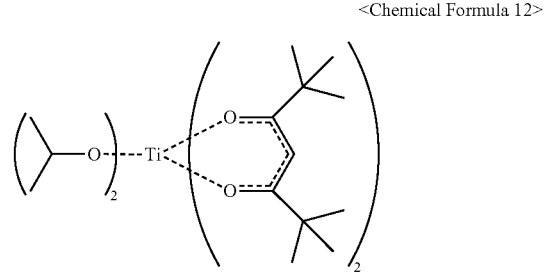

<Chemical Formula 13>

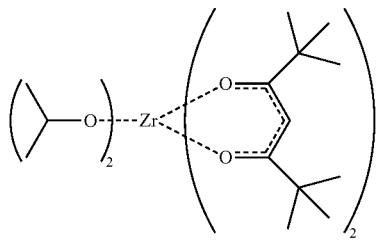

The compound of Chemical Formula 7 may be Bi(CH$_3$)$_3$, Bi(C$_6$H$_5$)$_3$, Bi(TMHD)$_3$, La(TMHD)$_3$, Ta(i-OPr)$_5$, Ta(i-OPr)$_4$(TMHD), Ta(i-OPr)$_4$(DMAE), or Ta(DMAE)$_5$, but the inventive concept is not limited thereto.

The compound of Chemical Formula 8 may be Ba(TMHD)$_2$, Ba(AcAc)$_2$, Ba(MEP)$_2$ (Ba(di(methoxyethoxy)-propanol)$_2$), Ba(MPMP)$_2$ (Ba(methoxypropylami-nomethoxyethoxypropanol)2), Ba(METHD)$_2$, Sr(TMHD)$_2$, Sr(AcAc)$_2$, Sr(MEP)$_2$, Sr(MPMP)$_2$, or Sr(METHD)$_2$, but the inventive concept is not limited thereto.

The pivotal elements of the first, second, and third precursors may be different from one another. In addition, oxygen (O$_2$) or a gas including oxygen, such as ozone (O$_3$), nitrogen dioxide (NO$_2$), or nitrous oxide (N$_2$O), may also be supplied into the reaction chamber during the chemical adsorption. Alternatively, a reaction chamber in which oxygen (O$_2$) or a gas including oxygen already exists may be used.

The material layer formed using the first, second, and third precursors may be formed of PZT (Pb(Zr, Ti)O$_3$), SBT (SrBi$_2$Ta$_2$O$_9$), BLT (Bi(La, Ti)O$_3$), PLZT (Pb(La, Zr)TiO$_3$), PNZT (Pb(Nb, Zr, Ti)O$_3$), BFO (BiFeO$_3$), or BST (Ba(Sr, Ti)O$_3$). However, the inventive concept is not limited to these materials.

Method of Forming a Material Layer (III)

Another method of forming the material layer may include a first cycle and a second cycle.

The first cycle may be performed only once during the formation of the material layer. Alternatively, the first cycle may be performed consecutively or nonconsecutively two to 10 times or more during the formation of the material layer. The first cycle includes chemically adsorbing a pivotal element of a first precursor onto a substrate surface by using one of an Fe precursor, a Co precursor, an Ni precursor, an Mn precursor, and a Pt precursor, reacting the pivotal element of the first precursor with a reaction gas including the compound defined by Chemical Formula 4 shown below, and chemically adsorbing a pivotal element of a second precursor onto the substrate surface by using one of the Fe precursor, the Co precursor, the Ni precursor, the Mn precursor, and the Pt precursor as the second precursor, the second precursor having a different pivotal element from the first precursor:

R—X                                                         <Chemical Formula 4> where X and R are the same as defined above.

The second cycle may be repeated several times while the material layer is formed. Typically, the second cycle may be repeated about 30 to about 250 times. The second cycle may include chemically adsorbing the pivotal element of the first precursor and chemically adsorbing the pivotal element of the second precursor.

The substrate surface onto which the pivotal element of the first precursor is chemically adsorbed during the first cycle may be the surface of the substrate on which the unit devices of a semiconductor device are formed and/or the surface of the interlayer dielectric film. Alternatively, the substrate surface may be the surface of a part of a material layer formed by a repetition of the first and/or second cycles.

The first and second cycles may be performed in the same manner as described above with reference to the method of forming the material layer (I), and thus a detailed description thereof is not provided here.

The first cycle and the second cycle may be performed in the same manner as described in the method of forming a material layer (I). Therefore, a detailed description thereof is not be provided here.

Optionally, the first cycle may further include chemically adsorbing the pivotal element of the third precursor by using one of the compounds of Chemical Formulas 1 through 3 as the third precursor, after reacting to the chemically adsorbed pivotal element of the first precursor with the reaction gas including the compound of Chemical Formula 4.

In addition, the second cycle may also further include chemically adsorbing the pivotal element of the third precursor by using one of the compounds of Chemical Formulas 1 through 3 as the third precursor.

If the first, second, and third precursors are used, the process employed in the method of forming a material layer (III) may be the same as those for the method of forming a material layer (I) and method of forming a material layer (II) described above, and thus a detailed description thereof will not be provided here.

The compound of Chemical Formula 4 may be CH$_3$F, CH$_3$Cl, CH$_3$Br, CH$_3$I, HF, HCl, HBr, HI, F$_2$, Cl$_2$, Br$_2$, I$_2$, or the like, and the inventive concept is not limited thereto.

Examples of the Fe precursor, the Co precursor, the Ni precursor, the Mn precursor, and the Pt precursor may include Fe(CO)$_5$, Fe(CO)$_2$(NO)$_2$, Fe$_2$(CO)$_9$, Fe$_2$(CO)$_8$, Fe$_2$(CO)$_7$, Fe$_2$(CO)$_6$, Fe$_3$(CO)$_{12}$, Co$_2$(CO)$_5$, Co$_2$(CO)$_6$, Co$_2$(CO)$_7$, Co$_2$(CO)$_8$Co(NH$_3$)$_5$(NO), Co(CO)$_3$(NO), Co$_4$(CO)$_{12}$, Mn$_2$(CO)$_{10}$, Mn(CO)(NO)$_3$, Ni(CO)$_4$, Ni$_2$(CO)$_5$, Ni$_2$(CO)$_6$, and Ni$_2$(CO)$_7$, but the inventive concept is not limited thereto. Besides, examples of the Fe precursor, the Co precursor, the Ni precursor, the Mn precursor, and the Pt precursor may include Chemical Formulas 14 through 16 below.

<Chemical Formula 14>

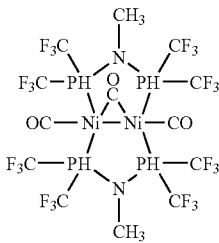

<Chemical Formula 15>

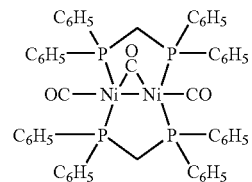

-continued

<Chemical Formula 16>

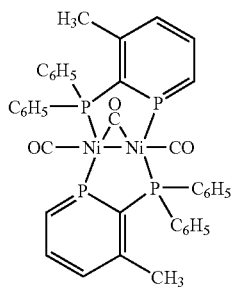

The pivotal elements of the first, second, and third precursors may be different from one another. In particular, group numbers of the pivotal elements of the first, second, and third precursors may be different from one another.

Optionally, at least one gas selected from the group consisting of $C_2H_2$, $NH_3$, $SiH_4$, and $O_2$ may exist within the reaction chamber during the chemical adsorption. In this case, an effect where the material layer is doped with elements such as C, N, Si, and O may be obtained.

The material layer obtained through the above-described process may be formed of FeCo, NiFe, NiFeCo, NiMn, FeMn, PtMn, or the like, but the inventive concept is not limited thereto.

Method of Fabricating a Memory Device

Figure 7A:
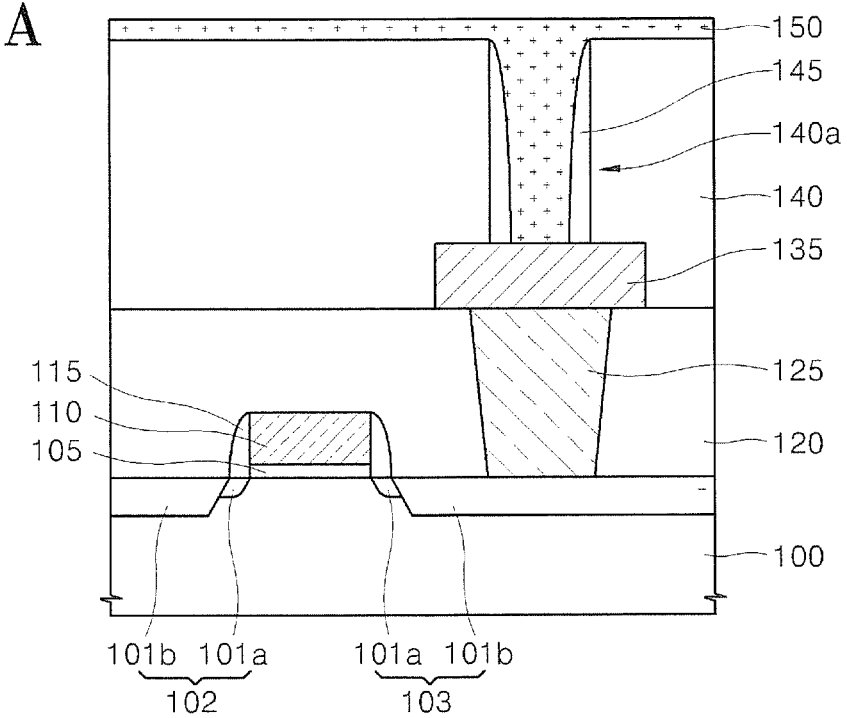
FIGS. 7A and 7B are side cross-sectional views illustrating a method of fabricating a memory device, according to an embodiment of the inventive concept.
Figure 7B:
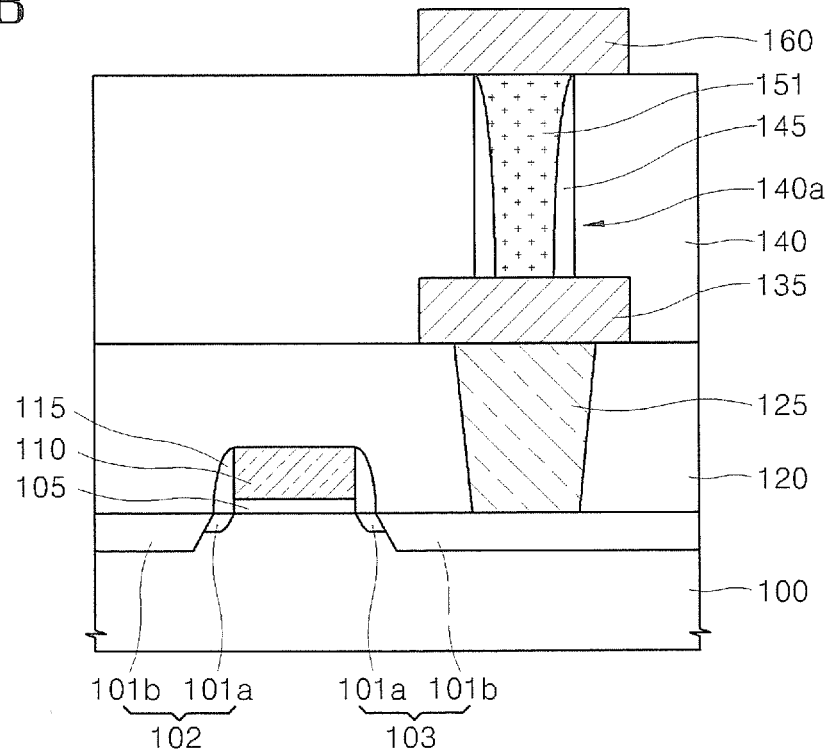

FIGS. 7A and 7B are side cross-sectional views illustrating a method of fabricating a memory device, according to an embodiment of the inventive concept.

Referring to FIG. 7A, an isolation film (not shown) is formed on a substrate 100, thereby defining an active region. A gate insulation layer 105 and a gate conductive layer (not shown) are sequentially formed on the active region. The gate conductive layer (not shown) and the gate insulation layer 105 are sequentially etched to form a gate electrode 110. The substrate 100 is doped with impurities at a low concentration by using the gate electrode 110 as a mask, thereby forming low-concentration impurity regions 101a adjacent to the gate electrode 110 within the substrate 100.

A gate spacer insulation layer is formed on the substrate 100 in which the low-concentration impurity regions 101 a are formed, and anisotropically etched to form gate spacers 115 on the sidewalls of the gate electrode 110. Thereafter, the substrate 100 is doped with impurities at a high concentration by using the gate electrode 110 and the gate spacers 115 as a mask, thereby forming high-concentration impurity regions 101b adjacent to the gate spacers 115 within the substrate 100.

The low-concentration impurity regions 101a and the high-concentration impurity regions 101b define a source/drain region. More specifically, the low-concentration impurity region 101a and the high-concentration impurity region 101b located on one side of the gate electrode 110 to form a source region 102, and the low-concentration impurity region 101a and the high-concentration impurity region 101b located on the other side of the gate electrode 110 form a drain region 103. The gate electrode 110, the source region 102, and the drain region 103 constitute a metal oxide semiconductor (MOS) transistor, which serves as an access device. However, the access device is not limited to a MOS transistor, and may be a diode or a bipolar transistor.

A first interlayer dielectric layer 120 is formed on the substrate 100 in which the source and drain regions 102 and 103 are formed. A contact plug 125 penetrates the first interlayer dielectric 120 and contacts the drain region 103. The contact plug 125 may be a tungsten layer.

A lower electrode 135 is formed on the contact plug 125 and covers the same. The lower electrode 135 may be formed of titanium nitride TiN, titanium aluminum nitride TiAlN, tantalum nitride TaN, tungsten nitride WN, molybdenum nitride MoN, niobium nitride NbN, titanium silicon nitride TiSiN, titanium boron nitride TiBN, zirconium silicon nitride ZrSiN, tungsten silicon nitride WSiN, tungsten boron nitride WBN, zirconium aluminum nitride ZrAlN, molybdenum aluminum nitride MoAlN, tantalum silicon nitride TaSiN, tantalum aluminum nitride TaAlN, titanium tungsten TiW, titanium aluminum TiAl, titanium oxynitride TiON, titanium aluminum oxynitride TiAlON, tungsten oxynitride WON, or tantalum oxynitride TaON.

A mold insulation layer 140 is formed on the lower electrode 135, and a via hole 140a exposing a portion of the lower electrode 135 is formed within the mold insulation layer 140. A hole spacer insulation layer (not shown) is formed on the mold insulation layer 140 and inside the via hole 140, and then anisotropically etched to expose the lower electrode 135 through the via hole 140a. As a result, hole spacers 145 are formed on sidewalls of the via hole 140a. Thus, an effective diameter of the via hole 140a may be reduced to be less than a resolution limit of photolithography by the hole spacers 145.

Thereafter, a material layer 150 is formed on the resultant structure. The material layer 150 may be any of the material layers formed according to the above-described methods of forming a material layer (I) through (III).

Referring to FIG. 7B, a material layer pattern 151 is formed by planarizing the material layer 150. An upper electrode 160 is formed on the material layer pattern 151. The material layer 150 may be planarized by etch back or chemical mechanical polishing (CMP). Consequently, a memory component including the lower electrode 135, the upper electrode 160, and the material layer pattern 151 formed between the lower and upper electrodes 135 and 160 is formed.

Figure 8A:
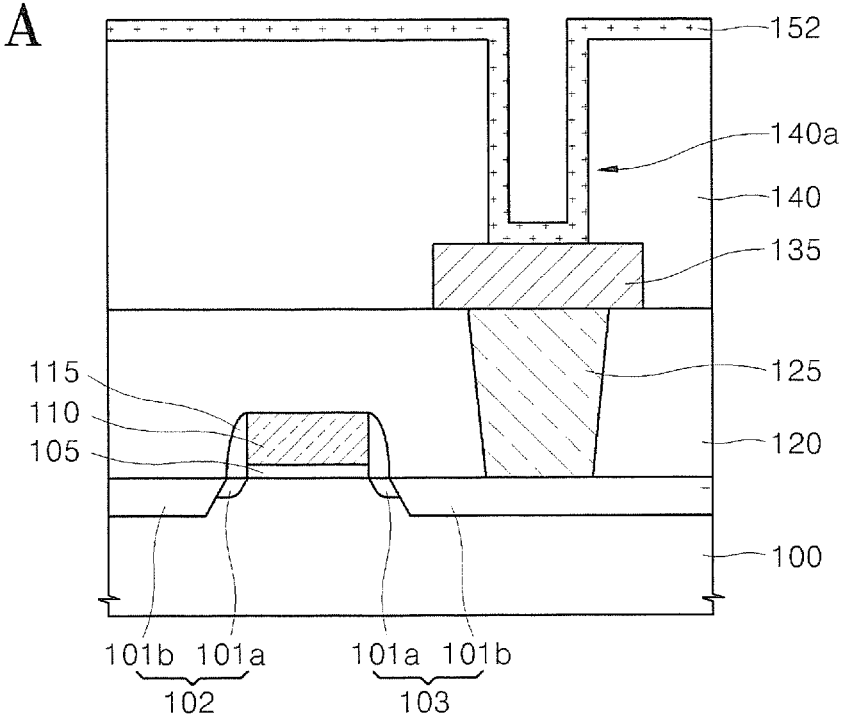
FIGS. 8A through 8C are side cross-sectional views illustrating a method of fabricating a memory device, according to another embodiment of the inventive concept.
Figure 8B:
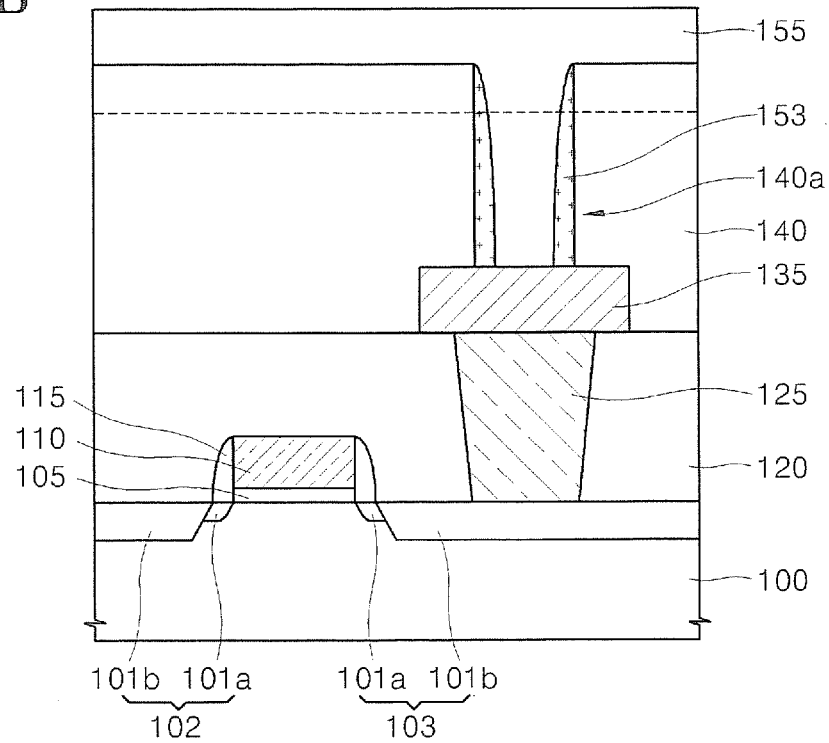
Figure 8C:
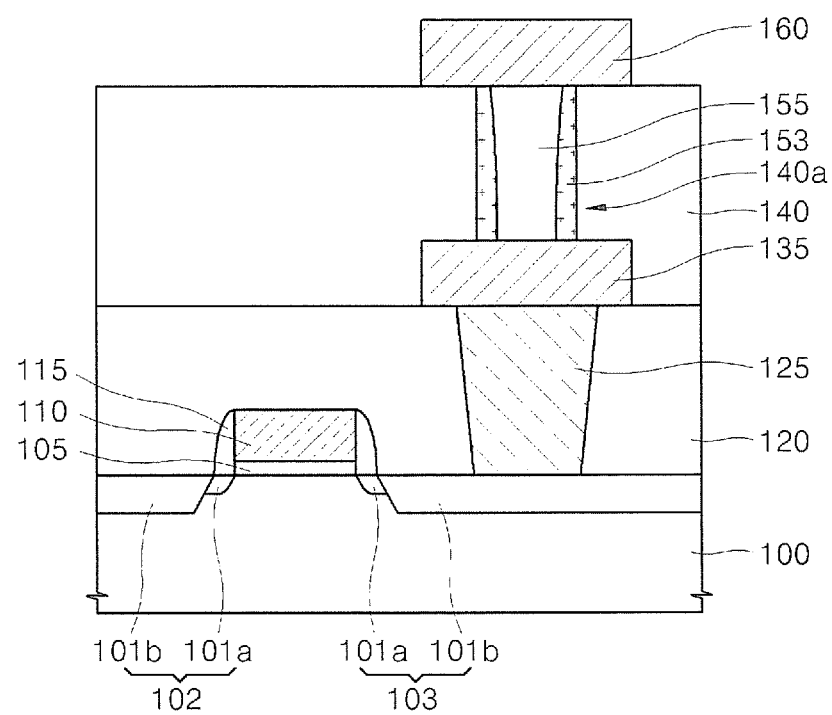

FIGS. 8A through 8C are side cross-sectional views illustrating a method of fabricating a memory device, according to another embodiment of the inventive concept. This method is similar to the method described above with reference to FIGS. 7A and 7B except for that which is described below.

Referring to FIG. 8A, a mold insulation layer 140 is formed on a lower electrode 135, and a via hole 140a exposing a portion of the lower electrode 135 is formed within the mold insulation layer 140. A material layer 152 is formed within the via hole 140a. More specifically, the material layer 152 is formed so as to conformally cover the sidewalls of the via hole 140A instead of filling the via hole 140A. The material layer 152 may be any of the material layers formed according to the above-described methods of forming a material layer (I) through (III).

Referring to FIG. 8B, the material layer 152 is anisotropically etched until the lower electrode 135 is exposed, thereby forming material layer spacers 153 on sidewalls of the via hole 140a and exposing an upper surface of the mold insulation layer 140 and an upper surface of the lower electrode 135. A buffer insulation layer 155 is formed on the exposed portion of the lower electrode 135 and the mold insulation layer 140. The buffer insulation layer 155 fills the via hole 140a. The sidewalls of the buffer insulation layer 155 within the via hole 140a are surrounded by the material layer spacers 153.

The resultant structure on which the buffer insulation layer 155 has been formed is planarized so that the upper surfaces of the material layer spacers 153 arc exposed. For example, the resultant structure on which the buffer insulation layer

155 has been formed may be planarized until reaching a broken line shown in FIG. 8B.

Referring to FIG. 8C, an upper electrode 160 is formed on the material layer spacers 153 whose upper surfaces have been exposed. Consequently, a memory component including the lower electrode 135, the upper electrode 160, and the material layer spacers 153 formed between the lower and upper electrodes 135 and 160 is formed. A contact area between the material layer spacers 153 and the lower electrode 135 may be reduced compared with the material layer pattern 151 described above with reference to FIG. 7B. Thus, the effective current density of a write current which is applied to the material layer spacers 153 can be increased.

The inventive concept will now be described in more detail with reference to the following experimental examples. However, these experimental examples are for illustrative purposes only and are not intended to limit the scope of the inventive concept.

EXPERIMENTAL EXAMPLES

Experimental Example 1

After a substrate was loaded into a reaction chamber, argon (Ar), which is a carrier gas, and a compound of Chemical Formula 5 shown below, as a first precursor, were injected into the reaction chamber for about two seconds in amounts of 500 sccm and 100 sccm, respectively. A temperature in the reaction chamber was 280° C., and a pressure thereof was 5 torr. Thereafter, hydrogen and Ar as purging gases were supplied into the reaction chamber in amounts of 500 sccm for about 5.0 seconds, and thus physically adsorbed or unreacted Ge precursor was removed from the reaction chamber. Chemically adsorbed Ge precursor was then reacted with $CH_3Br$ which serves as a reaction gas.

Chemical Formula 5

Next, $Sb(CH_3)(C_4H_8)$ in which a methyl group and a five-membered ring of 4 carbons are formed on a pivotal element of Sb was used as a second precursor and injected into the reaction chamber under the same conditions as that for the first precursor, thereby chemically adsorbing Sb onto the substrate.

After purging the remaining second precursors, $Te(t-C_4H_9)_2$ was used as a third precursor and injected into the reaction chamber under the same conditions as that for the first precursor, thereby chemically adsorbing Te onto the substrate (i.e., the first cycle).

In the same manner as that for the first cycle, Ge, Sb, and Te were deposited on the substrate by using the first, second, and third precursors, respectively, (i.e., the second cycle). The second cycle was repeated 100 times, thereby forming a GeSbTe material layer.

Figure 9:
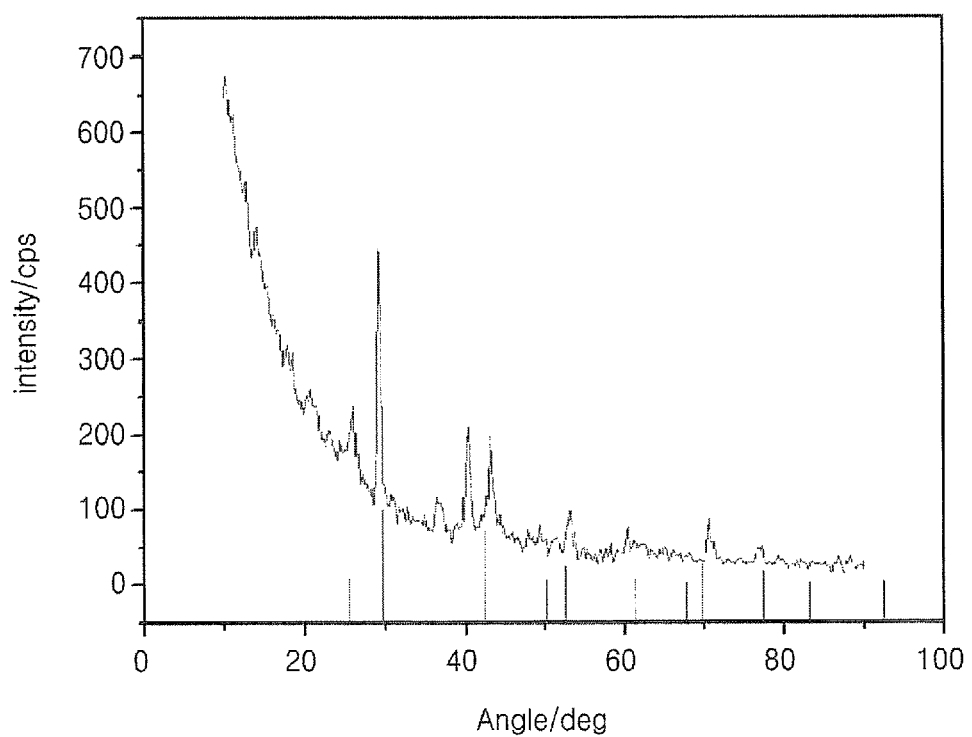
FIG. 9 is a graph showing a result of an XRD analysis on a material layer formed according to an embodiment of the inventive concept.

FIG. 9 is a graph showing a result of an x-ray diffraction (XRD) analysis on the GeSbTe material layer. Referring to FIG. 9, an atomic ratio of Ge:Sb:Te is 2:2:5. A GeSbTe material layer having no voids was uniformly formed within a via hole having a 50 nm diameter.

Experimental Example 2

A material layer was formed using the same method as that of Experimental Example 1 except that $Se[C(CH_3)_3]_2$, $Te(t-C_4H_9)_2$, and $Sn[N(CH_3)_2]_4$ were used as the first, second, and third precursors, respectively. Consequently, a SeTeSn material layer having no voids was uniformly formed within a via hole having a 50 nm diameter.

Experimental Example 3

A material layer was formed using the same method as that of Experimental Example 1 except that $Pb(TMHD)_2$, $Zr(DMAE)_4$, and $Ti(DMAE)_4$ were used as the first, second, and third precursors, respectively. Consequently, a PZT material layer having no voids was uniformly formed within a via hole having a 50 nm diameter.

Experimental Example 4

A material layer was formed using the same method as that of Experimental Example 1 except that $Pb(METHD)_2$, $Zr(O-t-C_4H_9)_4$, and $Ti[N(C_2H_5)_2]_4$ were used as the first, second, and third precursors, respectively. Consequently, a PZT material layer having no voids was uniformly formed within a via hole having a 50 nm diameter.

Experimental Example 5

A material layer was formed using the same method as that of Experimental Example 1 except that $Sr(TMHD)_2$, $Bi(C_6H_5)_3$, and $Ta(i-OPr)_4(DMAE)$ were used as the first, second, and third precursors, respectively. Consequently, an SBT material layer having no voids was uniformly formed within a via hole having a 50 nm diameter.

Experimental Example 6

A material layer was formed using the same method as that of Experimental Example 1 except that $Sr(TMHD)_2$, $Ba(MEP)_2$, and a compound of Chemical Formula 12 shown below were used as the first, second, and third precursors, respectively. Consequently, a BST material layer having no voids was uniformly formed within a via hole having a 50 nm diameter.

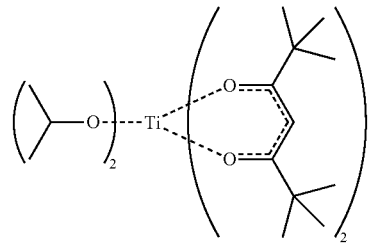

Chemical Formula 12

Experimental Example 7

A material layer was formed using the same method as that of Experimental Example 1 except that $Ni_2(CO)_6$ and $Fe_2(CO)_8$ were used as the first and second precursors, respectively, and a third precursor was not used. Consequently, a Ni/Fe material layer having no voids was uniformly formed within a via hole having a 50 nm diameter.

Experimental Example 8

A material layer was formed using the same method as that of Experimental Example 7 except that $Fe_2(CO)_8$ and $Co_2(CO)_8$ were used as the first and second precursors, respectively. Consequently, a Co/Fe material layer having no voids was uniformly formed within a via hole having a 50 nm diameter.

As described above, the inventive concept provides methods of forming a material layer and a method of fabricating a semiconductor device using a material layer formed using the method described herein.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A method of forming a material layer, the method comprising:
  (a) a first cycle comprising:
    chemically adsorbing a pivotal element of a first precursor onto a substrate surface by using a compound of Chemical Formula 1, 2 or 3 as the first precursor;
    reacting the chemically adsorbed pivotal element of the first precursor with a reaction gas comprising a compound of Chemical Formula 4 to provide a negative charge to the substrate surface; and
    chemically adsorbing a pivotal element of a second precursor onto the substrate surface by using a compound of Chemical Formula 1, 2 or 3 as the second precursor, the second precursor having a different pivotal element from the first precursor; and
  (b) a second cycle comprising:
    chemically adsorbing the pivotal element of the first precursor; and
    chemically adsorbing the pivotal element of the second precursor,
  wherein the Chemical Formulas are defined as follow:

$$M_1R_1R_2R_3R_4; \qquad \text{<Chemical Formula 1>}$$

$$M_2R_5R_6R_7; \text{ and} \qquad \text{<Chemical Formula 2>}$$

$$M_3R_8R_9 \qquad \text{<Chemical Formula 3>}$$

where a pivotal element $M_1$ is Ge, Si, Sn, Ga, In, or Ti; a pivotal element $M_2$ is Sb, As, Bi, Ga, or In; a pivotal element $M_3$ is Te or Se; and
  $R_1$ through $R_9$ are each independently a hydrogen, a methyl group or a branched hydrocarbon chain of 2 to 5 carbons or two of $R_1$ through $R_4$, two of $R_5$ through $R_7$, or a pair of $R_8$ and $R_9$ are connected to each other directly or via a hydrocarbylene group of 2 to 6 carbons so as to form a homo or hetero ring-shaped hydrocarbon, wherein a backbone of the branched hydrocarbon chain optionally comprises at least one of O, N, S, P, Si, Te, Sb, Se, Sn, Bi, or In, and the hydrogen atoms of the branched hydrocarbon chain are unsubstituted or substituted with a substituent selected from the group consisting of an alkyl group of 1 to 10 carbons, an allyl group of 3 to 10 carbons, a vinyl group of 2 to 10 carbons, an amine group, a halogen group, a cyano group, and an aryl group of 6 to 10 carbons;
  wherein:

$$R\text{—}X \qquad \text{<Chemical Formula 4>}$$

where X is F, Cl, Br, or I, and
  R is hydrogen, an alkyl group of 1 to 10 carbons, an allyl group of 3 to 10 carbons, a vinyl group of 2 to 10 carbons, an amine group, a cyano group, an aryl group of 6 to 10 carbons, or a halogen group that is the same as X.

2. The method of claim 1, wherein a group number of the pivotal element of the first precursor is different from a group number of the pivotal element of the second precursor.

3. The method of claim 1, wherein the material layer comprises GeTe, SbTe, or InSe.

4. The method of claim 1, wherein the reaction chamber comprises at least one gas selected from the group consisting of $C_2H_2$, $NH_3$, $SiH_4$, and $O_2$ during the chemical adsorption.

5. The method of claim 1, wherein the pressure of the reaction chamber during the chemical adsorption is in a range of about 1 torr to about 10 torr based on an absolute pressure.

6. The method of claim 1, wherein the reaction of the chemically adsorbed pivotal element of the first precursor with the reaction gas occurs at a temperature in a range of about 200° C. to about 400° C.

7. The method of claim 1, wherein the second cycle is repeated about 30 to about 250 times.

8. The method of claim 1, wherein the first cycle further comprises chemically adsorbing a pivotal element of a third precursor by using a compound of Chemical Formula 1, 2 or 3 as the third precursor, after reacting the chemically adsorbed pivotal element of the first precursor with the reaction gas comprising the compound of Chemical Formula 4.

9. The method of claim 8, wherein the pivotal element of the third precursor is different from the pivotal elements of the first and second precursors.

10. The method of claim 8, wherein group numbers of the pivotal elements of the first, second, and third precursors are different from one another.

11. The method of claim 8, wherein a material deposited to form the material layer is a material selected from the group consisting of GeSbTe, GeTeAs, SbTeSn, SeTeSn, GeTeSe, SbSeBi, GeBiTe, GeTeTi, GaTeSe, and InSbTe.

12. A method of fabricating a phase-change memory device, the method comprising:
  forming a first electrode on a substrate;
  forming an insulation layer on the substrate, the insulation layer comprising a via hole through which the first electrode is exposed; and
  forming a phase-change layer within the via hole,
  wherein forming the phase-change layer within the via hole comprises:
    (a) a first cycle comprising:
      chemically adsorbing a pivotal element of a first precursor onto a surface of the substrate by using a compound of Chemical Formula 1, 2 or 3 as the first precursor;
      reacting the chemically adsorbed pivotal element of the first precursor with a reaction gas comprising a compound of Chemical Formula 4 to provide a negative charge to the substrate surface; and
      chemically adsorbing a pivotal element of a second precursor onto a surface of the substrate a compound of Chemical Formula 1, 2 or 3 as the second precursor, the second precursor having a different pivotal element from the first precursor; and
    (b) a second cycle comprising:
      chemically adsorbing the pivotal element of the first precursor; and
      chemically adsorbing the pivotal element of the second precursor;
  wherein the Chemical Formulas are defined as follow:

$$M_1R_1R_2R_3R_4; \qquad \text{<Chemical Formula 1>}$$

$$M_2R_5R_6R_7; \qquad \text{<Chemical Formula 2>}$$

$$M_3R_8R_9; \text{ and} \qquad \text{<Chemical Formula 3>}$$

$$R\text{—}X \qquad \text{<Chemical Formula 4>}$$

where pivotal elements $M_1$, $M_2$, $M_3$, and $R_1$ through $R_9$ in Chemical Formulas 1, 2 and 3 are the same as those defined in claim 1, and X and R are the same as those defined in claim 1.

13. The method of claim 12, further comprising forming a seed layer on the first electrode before forming the phase-change layer.

14. The method of claim 12, wherein the seed layer comprises titanium oxide, a zirconium oxide, or magnesium oxide.

* * * * *